(12) United States Patent
Faulkner et al.

(10) Patent No.: US 9,381,588 B2
(45) Date of Patent: Jul. 5, 2016

(54) MULTI-METAL PARTICLE GENERATOR AND METHOD

(71) Applicants: Donald G. Faulkner, Charlotte, NC (US); Darren R. Burgess, Charlotte, NC (US); David John Fennimore, Mills River, NC (US)

(72) Inventors: Donald G. Faulkner, Charlotte, NC (US); Darren R. Burgess, Charlotte, NC (US); David John Fennimore, Mills River, NC (US)

(73) Assignee: Lotus BioEFx, LLC, Chapel Hill, NC (US)

( * ) Notice: Subject to any disclaimer, the term of this patent is extended or adjusted under 35 U.S.C. 154(b) by 398 days.

(21) Appl. No.: 13/790,034

(22) Filed: Mar. 8, 2013

(65) Prior Publication Data

US 2014/0255716 A1 Sep. 11, 2014

(51) Int. Cl.
| | |
|---|---|
| *B23K 10/00* | (2006.01) |
| *B23H 1/02* | (2006.01) |
| *B22F 1/00* | (2006.01) |
| *B22F 9/14* | (2006.01) |

(52) U.S. Cl.
CPC ............... *B23H 1/02* (2013.01); *B22F 1/0018* (2013.01); *B22F 9/14* (2013.01); *B22F 2999/00* (2013.01); *Y10T 428/12* (2015.01); *Y10T 428/12181* (2015.01)

(58) Field of Classification Search
CPC . B23H 1/02; Y10T 428/12181; B22F 1/0018; B22F 9/14; B22F 2999/00; H05H 1/32; H05H 1/36; H05H 1/38; H05H 1/42
USPC ............. 219/121.47, 76.15, 76.16, 121.36, 219/121.43, 121.52, 121.54, 121.56
See application file for complete search history.

(56) References Cited

U.S. PATENT DOCUMENTS

| | | | |
|---|---|---|---|
| 3,616,277 | A | 10/1971 | Tuddenham |
| 4,046,643 | A | 9/1977 | Rippere |
| 4,120,758 | A | 10/1978 | Rippere |
| 4,731,515 | A | 3/1988 | Savage et al. |
| 5,370,784 | A | 12/1994 | Kammel et al. |
| 5,454,886 | A | 10/1995 | Burrell et al. |
| 5,668,076 | A | 9/1997 | Yamagushi et al. |
| 5,879,518 | A | 3/1999 | Kuehnle |
| 5,935,461 | A | 8/1999 | Witherspoon et al. |
| 6,126,931 | A | 10/2000 | Sawan et al. |
| 6,238,686 | B1 | 5/2001 | Burrell et al. |
| 6,267,782 | B1 | 7/2001 | Ogle et al. |
| 6,273,875 | B1 | 8/2001 | Siman et al. |
| 6,313,064 | B1 | 11/2001 | Miyafuji et al. |
| 6,361,567 | B1 | 3/2002 | Dearnaley |
| 6,630,106 | B1 | 10/2003 | Levy |
| 6,719,987 | B2 | 4/2004 | Burrell et al. |
| 6,866,859 | B2 | 3/2005 | Trogolo et al. |
| 6,972,115 | B1 | 12/2005 | Ballard |

(Continued)

FOREIGN PATENT DOCUMENTS

| | | |
|---|---|---|
| DE | 2801918 A1 | 7/1979 |
| DE | 102008040784 B3 | 12/2009 |

(Continued)

*Primary Examiner* — Mark Paschall
(74) *Attorney, Agent, or Firm* — Christopher J. Knors; Michael G Johnson; Moore & Van Allen PLLC

(57) ABSTRACT

Multi-metal particles, apparatuses and method of making same are provided. Specifically, the multi-metal particles are of nanometer dimensions and are prepared by spatially arranged electrodes configured to generate and maintain a plasma cloud.

33 Claims, 6 Drawing Sheets

(56) References Cited

U.S. PATENT DOCUMENTS

| | | |
|---|---|---|
| 7,081,139 B2 | 7/2006 | Joerger et al. |
| 7,169,402 B2 | 1/2007 | Gabbay |
| 7,288,264 B1 | 10/2007 | Sawan et al. |
| 7,300,491 B2 | 11/2007 | Hirata et al. |
| 7,390,774 B2 | 6/2008 | Ghosh et al. |
| 7,576,255 B2 | 8/2009 | Gibbins et al. |
| 7,780,647 B2 | 8/2010 | Paul et al. |
| 7,820,284 B2 | 10/2010 | Terry |
| 7,846,856 B2 | 12/2010 | Ghosh et al. |
| 8,128,789 B2 | 3/2012 | Hirata et al. |
| 2001/0021875 A1 | 9/2001 | Enzerink et al. |
| 2004/0168922 A1 | 9/2004 | Smedley et al. |
| 2005/0155939 A1 | 7/2005 | Stadelmann |
| 2006/0161256 A1 | 7/2006 | Ziegler et al. |
| 2007/0101823 A1 | 5/2007 | Sen et al. |
| 2008/0051911 A1 | 2/2008 | Rucker |
| 2008/0063679 A1 | 3/2008 | Sawafta et al. |
| 2008/0086214 A1 | 4/2008 | Hardin et al. |
| 2008/0187603 A1 | 8/2008 | Sawafta |
| 2009/0186064 A1 | 7/2009 | Szycher |
| 2009/0218266 A1 | 9/2009 | Sawafta et al. |
| 2010/0015193 A1 | 1/2010 | Inaoka et al. |
| 2010/0061884 A1 | 3/2010 | Clark et al. |
| 2010/0089759 A1 | 4/2010 | Watanabe et al. |
| 2010/0193363 A1 | 8/2010 | Jayaraman |
| 2010/0229684 A1 | 9/2010 | Takata et al. |
| 2011/0002971 A1 | 1/2011 | Hassler et al. |
| 2011/0038752 A1 | 2/2011 | Smith |
| 2011/0042004 A1 | 2/2011 | Schubert et al. |
| 2011/0060313 A1 | 3/2011 | Liu et al. |
| 2011/0079427 A1 | 4/2011 | Powale et al. |
| 2011/0098724 A1 | 4/2011 | Cichocki et al. |
| 2011/0143127 A1 | 6/2011 | Gupta et al. |
| 2011/0152042 A1 | 6/2011 | Anderson |
| 2012/0272789 A1 | 11/2012 | Auvinen et al. |

FOREIGN PATENT DOCUMENTS

| | | |
|---|---|---|
| DE | 102009046743 A1 | 5/2011 |
| EP | 1449605 A1 | 8/2004 |
| EP | 2316524 A1 | 5/2011 |
| FR | 2780417 A1 | 12/1999 |
| JP | 01317121 A | 12/1989 |
| JP | 02166202 B | 6/1990 |
| JP | 04350107 B2 | 12/1992 |
| JP | 05098475 A | 4/1993 |
| JP | 09111380 A | 4/1997 |
| JP | 09194901 A | 7/1997 |
| JP | 10130885 A | 5/1998 |
| JP | 03027785 B2 | 4/2000 |
| JP | 2000287858 A | 10/2000 |
| JP | 2001078661 A | 3/2001 |
| RU | 2397958 C1 | 8/2010 |
| WO | 9818330 A1 | 5/1998 |
| WO | 0178799 A1 | 10/2001 |
| WO | 0243905 A2 | 6/2002 |
| WO | 02087340 A1 | 11/2002 |
| WO | 03080275 A | 10/2003 |
| WO | 2005023206 A2 | 3/2005 |
| WO | 2008147395 A2 | 12/2008 |
| WO | 2009121970 A2 | 10/2009 |
| WO | 2010030597 A2 | 3/2010 |
| WO | 2011030538 A1 | 3/2011 |
| WO | 2011056013 A1 | 5/2011 |
| WO | 2011058123 A1 | 5/2011 |
| WO | 2011060034 A1 | 5/2011 |
| WO | 2011073194 A1 | 6/2011 |
| WO | 2011075088 A1 | 6/2011 |
| WO | 2011078492 A1 | 6/2011 |
| WO | 2011155473 A1 | 12/2011 |

MULTI-METAL PARTICLE GENERATOR AND METHOD

TECHNICAL FIELD

This disclosure relates to multi-metal particles, apparatuses and method of making same. Specifically, the multi-metal particles are of nanometer dimensions and are prepared by spatially arranged electrodes configured to generate and maintain a plasma cloud.

BACKGROUND

Particles with a size below 1 micron find a range of applications, including catalysis, low temperature sintering, solid rocket fuel, cold-gas spray coating, powder injection molding, magnetic carriers, metallic paint and conducting paste. Particles below 1 micron typically exhibit high reactivity and/or activity and can be used in many applications.

Conventional industrial production of micron/nanometer metal powders by reduction, decomposition and gas/water atomisation produce a wide size distribution from 2 microns to 500 micron and a range of particle morphology from spherical to irregular. The weight fraction of particles with size below 5 micron is usually below 7%, which constitutes a very low yield and therefore, such conventional processes are not economically viable for the large scale production of fine powder particles.

Further, it is difficult to produce such particles with controlled chemical composition in combination with controlled morphology, in particular, bi-. and multi-metal particles in that size range.

SUMMARY

In a first embodiment, an apparatus is provided. The apparatus comprising: a controller; a first electrode; a second electrode, the second electrode arranged spaced apart from said first electrode defining a plasma cloud zone sized to generate a plasma cloud; an electrical power supply coupled to the controller and arranged for applying one or more high voltage pulses to the first and second electrodes; a current detector coupled to the controller and at least one of the first or the second electrodes, the current detector configured and arranged to provide a first signal corresponding to the plasma cloud zone; and a linear actuator coupled to controller and at least one of the first and the second electrodes, the linear actuator coupled to the controller and configured and arranged to advance one or more of the first or second electrode corresponding to the first signal; optionally, a fluid controller configured and arranged for introducing a liquid into the plasma cloud zone.

In a second embodiment, a method of producing multi-metal particles is provided. The method comprising; supporting a first pair of elongated electrodes coaxially arranged with corresponding ends thereof spaced apart, the pair of elongated electrodes defining a plasma cloud zone, wherein combination of the first pair of elongated electrodes comprise at least two metals; applying a potential difference to the first electrode pair so that a plasma cloud is formed and at least substantially maintained in the plasma cloud zone between the first pair of elongated electrode ends; and consuming at least a portion of one or more of the at least one pair of electrodes; optionally, directing a fluid stream around or through at least one of the electrodes of the first pair of elongated electrodes and towards the plasma cloud zone.

In a third embodiment, a system for producing multi-metal particles or solutions thereof is provided. The system comprising: a reaction chamber configured to retain a fluid medium; power supply source capable of controlling electric current and/or voltage; a metal or metal alloy cathode operably connected to the power supply source; a metal or metal alloy anode operably connected to the power supply source and spaced apart from the metal or metal alloy cathode such that a plasma cloud zone is defined between the metal or metal alloy anode and metal or metal alloy cathode, wherein at least two metals constitute the combination of cathode and anode; a control unit arranged and configured for moving at least one of the anode or the cathode to maintain the plasma cloud zone; and optionally, a flow controller configured to deliver a fluid, optionally containing particulate matter, into the plasma cloud zone.

DETAILED DESCRIPTION

Definitions

The phrase "plasma cloud zone" relates generally to a volume of sustained arc or arc-like discharge, typically created by high-voltage or high radiofrequency energy. In the context of the present disclosure, the phrase plasma cloud zone is inclusive of a volume defined by the spacing between adjacently positioned electrodes that are separated a sufficient distance to arc and/or form and/or sustain a plasma discharge when energized by high-energy. The plasma cloud zone may present the volume that is geometrically similar to that of a sphere or spheroid-like volume.

The phrase "plasma cloud" generally relates to the environment within, or the immediate vicinity of, the plasma cloud zone. The plasma cloud is inclusive of high energy aggregated particles of one or more species, atoms, and/or compounds, any or all of which can be positively, negatively, or neutrally charged.

The term "fluid" is inclusive of water and/or a solution, a suspension, dispersion, or slurry of particulate matter in water and/or other liquid carrier, with or without gases.

Apparatus

In one aspect, the present apparatus for producing multi-metal particles can be configured with a housing, the housing sized to receive two or more individual electrodes or one or more pairs of electrodes. For purposes of discussion, the electrodes are hereinafter referred to as "elongated electrodes" (e.g., wires or tubes), however one or more of the electrodes can be disks or disk-like shapes or other geometrical forms. The apparatus can include one or more support members for supporting the elongated electrodes in the housing and providing for the electrodes to be arranged on a common axis so that their ends or faces oppose one another across a gap distance defining a plasma cloud zone. The supports can include means for providing electrical energy to the electrodes, such as by wires, rings, or other means. Additional elongated electrodes can be arranged along a common intersecting axis, or off-axis therefrom, provided that the longitudinal axes of the additional elongated electrodes intersect in proximity to the plasma cloud zone. In one aspect, at least one of the elongated electrodes is tubularly configured, for example, to allow for the passage of a fluid and/or substance therein.

Figure 1:
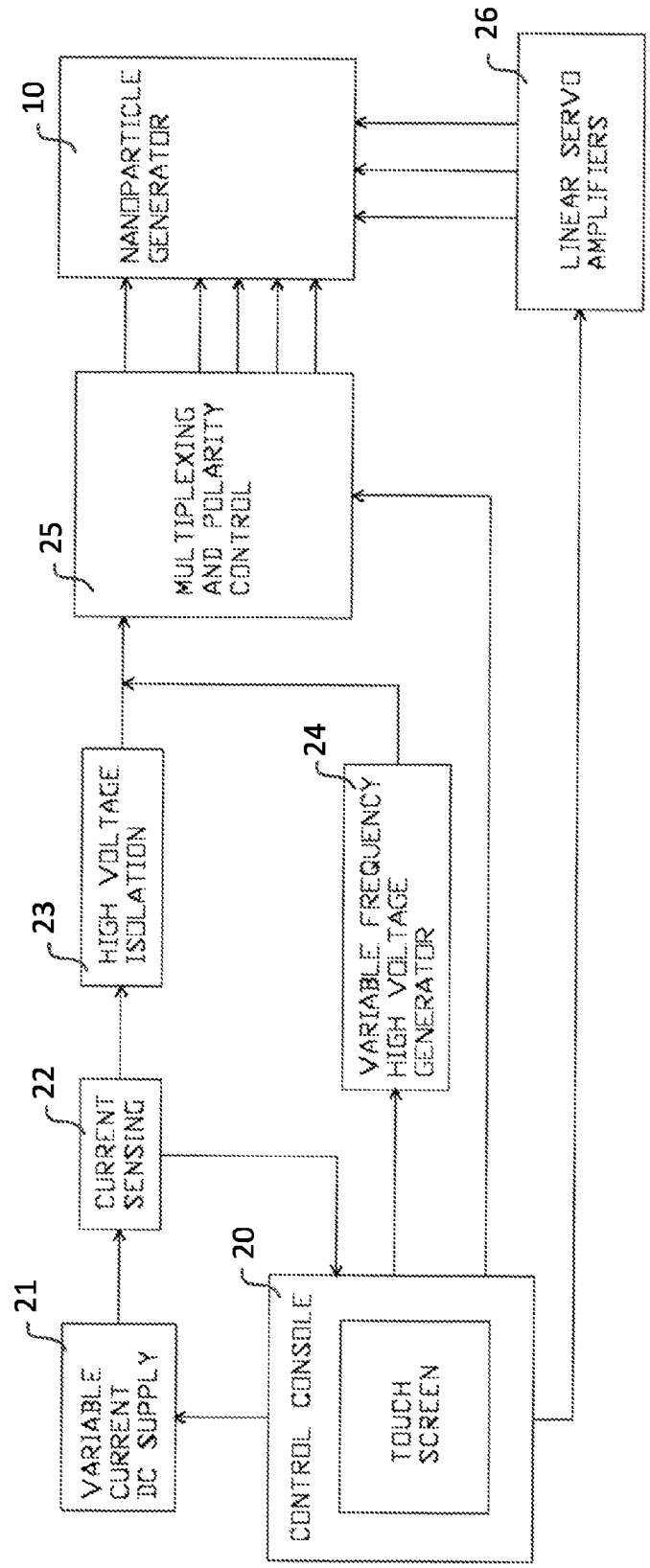
FIG. 1 depicts a flow chart of an exemplary method disclosed herein.

With reference to FIG. 1, a flow diagram of an embodiment of the present disclosure is provided. Thus, reactor 10 (also referred to as "nanoparticle generator") is coupled to controller 20, comprising a control console with touch screen. Controller 20 is operably coupled to a number of interconnected devices, namely, a power supply 21 (or variable current DC supply capable of up to about 125 amps), multiplexing and polarity controller 25, and variable frequency high voltage generator 24. Operably coupled to the controller 20 and the multiplexing and polarity controller 25, is current sensing device 22 and high-voltage isolation device 23 configured in line with variable current DC supply 21. Controller 20 is also operably connected to linear servo amplifier of electrode feed mechanism assembly 26, discussed in further detail below.

Figure 2:
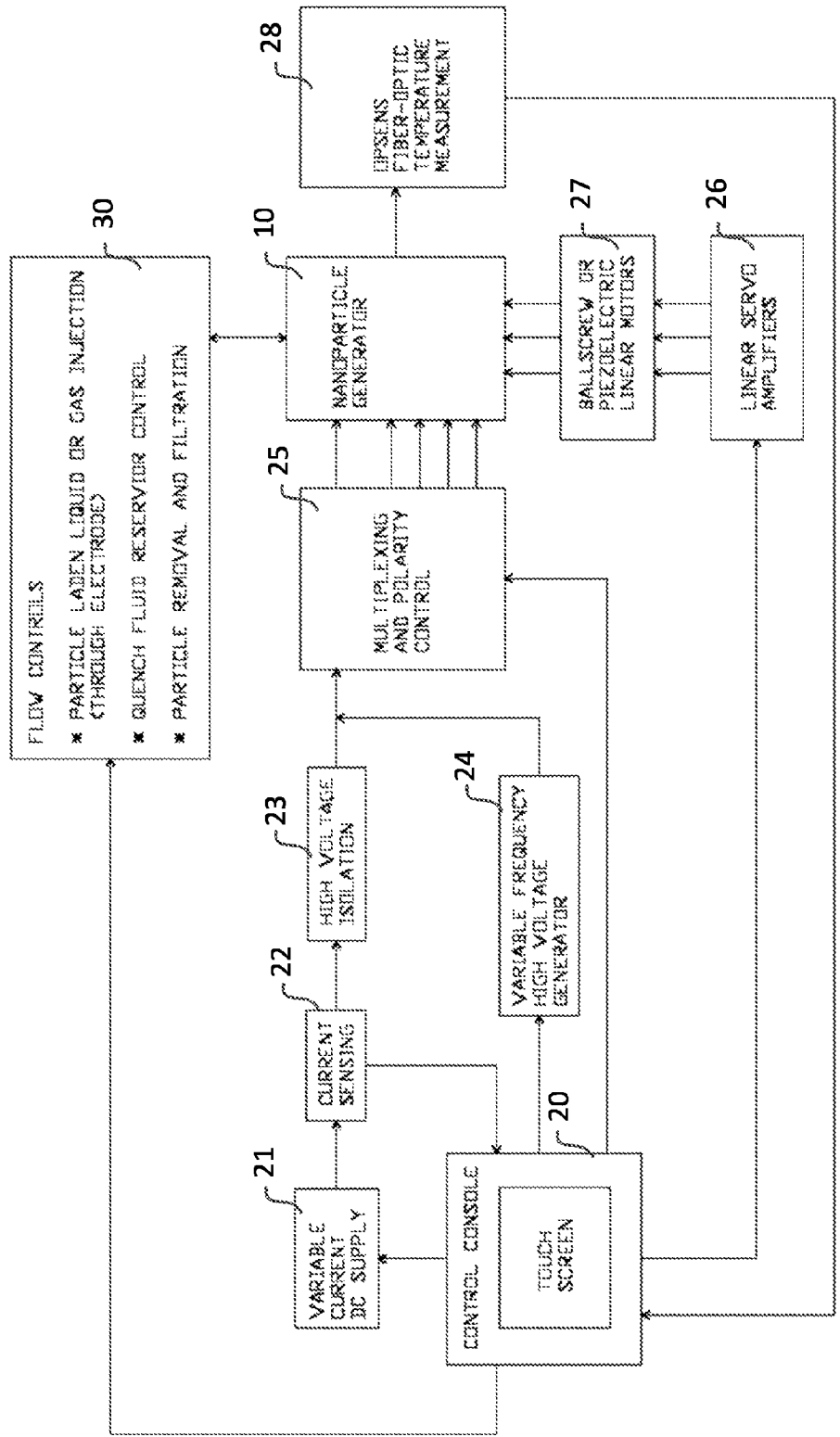
FIG. 2 depicts a flow chart of an exemplary method disclosed herein.

With reference to FIG. 2, a second flow diagram of a second embodiment of the present disclosure is provided, similar in many aspects to the embodiment depicted in FIG. 1. Additional devices and controls depicted in FIG. 2 include a flow controller 30 functioning to introduce and/or control a fluid in or out of reactor 10, as well as to introduce particulate matter to reactor 10 and/or remove multi-metal particles produced by reactor 10. Sensors, represented by exemplary fiber optic temperature measurement device 28, provide one or more signals to controller 20 and/or its interconnected devices. An electrode feed mechanism assembly 26 is shown, which may comprise a linear servo amplifier to drive a ballscrew and/or piezoelectric linear actuator.

Variable frequency high-voltage (AC) generator 24 provides an arc discharge that forms a conductive pathway for DC current provided by DC power supply 21 for establishing and/or maintaining the arc. Variable current DC supply unit 21 can be used to provide a potential difference to the electrodes to initiate and/or ignite an arc or plasma cloud within a volume defined by the special relationships of the electrodes and referred to herein as "plasma cloud zone" causing vaporization of one or more of the electrode materials in proximity to the plasma cloud zone to form multi-metal particles in the housing. Flow controller 30 is in fluid communication to the housing and/or electrodes for providing fluid communication with the housing. In one aspect the flow controller provides a fluid stream substantially parallel to the longitudinal axes of one or more of the electrodes towards the plasma cloud zone. The housing is configured to contain and/or control the fluid so as to suspend and/or collect and/or separate the multi-metal particles during and/or after formation.

Figure 3:
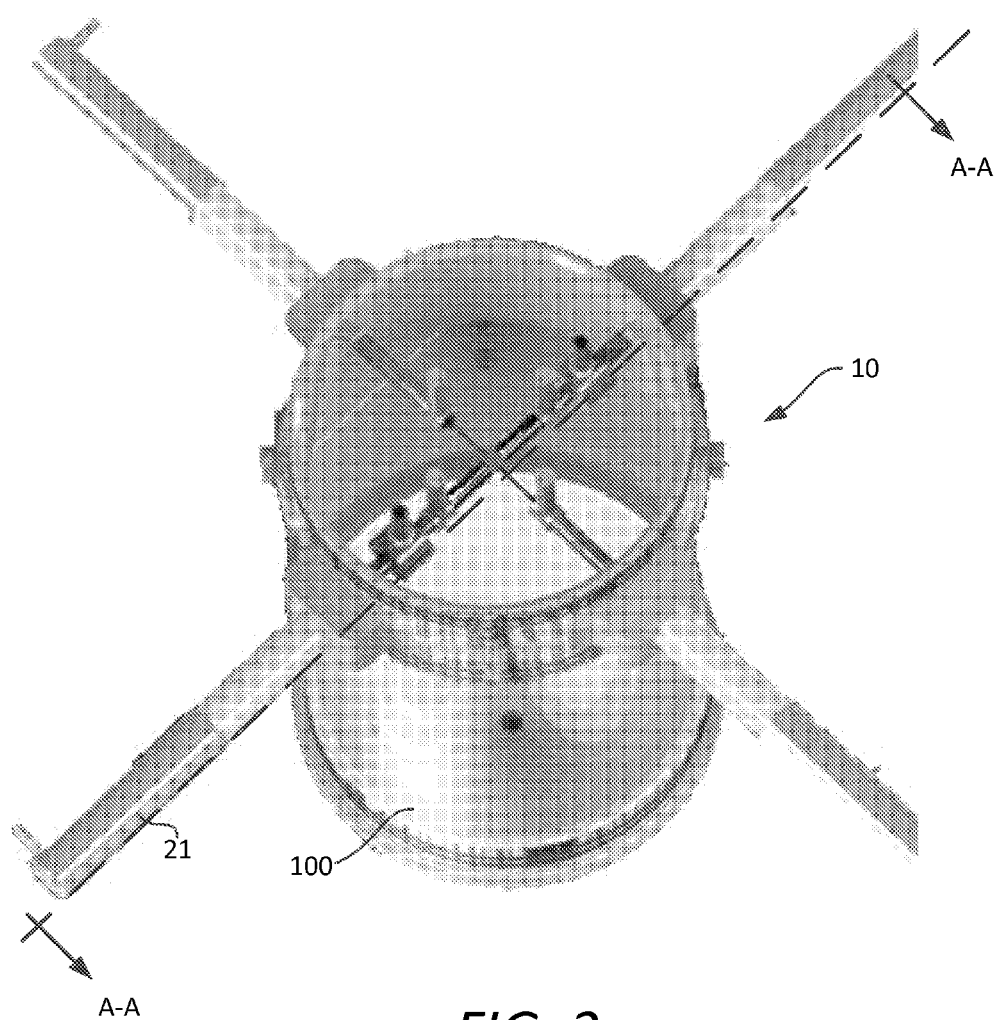
FIG. 3 depicts a top perspective view of an apparatus embodiment of the present disclosure.
Figure 4:
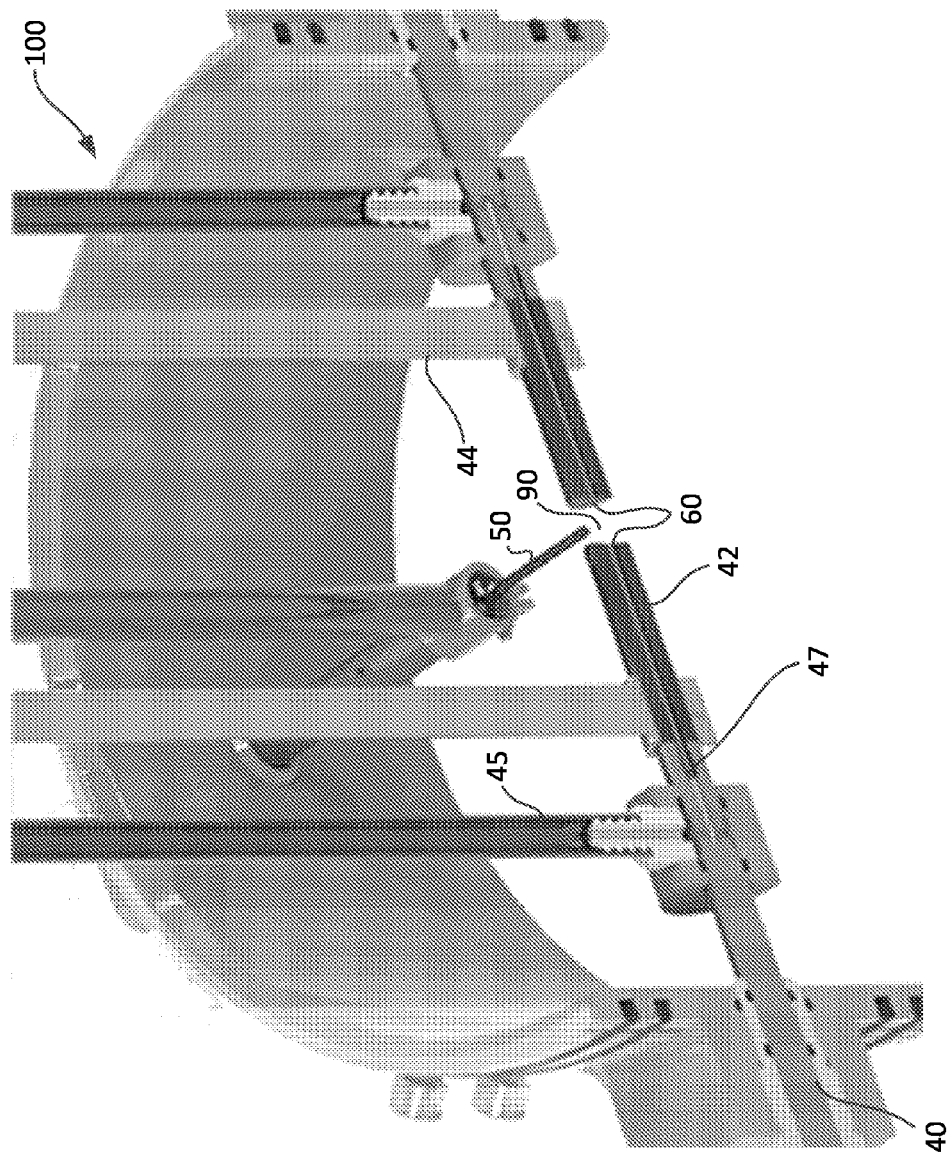
FIG. 4 depicts a section view of the apparatus of FIG. 3 along line A-A.

Referring now to FIGS. 3 and 4, a perspective view of the inside of reactor 10, depicting an exemplary electrode arrangement is shown. As illustrated in FIG. 3, housing 100 comprises two pairs of electrodes, depicted by way of example as one pair of cathodes 50 and another pair of anodes 60. Additional anodes or cathodes can be arranged either coaxially or off axis to each other provided that the ends of each of the electrodes are arranged such that they form a gap or common volume between all of the electrodes such that the gap defines a plasma cloud zone 90. One or more supporting members 44, 45 slidably supports electrode 60, which also provide the spatial relationship of the electrodes, and/or support the electrodes and/or provide electrical conductivity to the electrodes. In the exemplary example depicted in FIGS. 3 and 4, electrodes 60 are shown with an insulative cover 47 which can be of any suitable dielectric material. As best seen in FIG. 4, electrode 60 can be frictionally engaged in the support, as well as by any seals positioned within the support. Fluid controller 30 can access housing 100 via conduit 40, and present fluid to plasma cloud zone 90 either through the interior of electrodes 60 or by way of channel 42 surrounding electrodes 60.

In one aspect, a lid/cover (not shown) is provided for supporting and/or providing electrical energy to the electrodes, as well as flow controller supply lines, electrode feet and adjustment components, which components together with the supporting frame constitute an assembly that can be removable from housing 100.

Housing 100 can be more or less cylindrical, but other shapes can be used. In one aspect, the apparatus comprises a generally cylindrical housing 100 made of a high temperature resistant plastic, glass, ceramic, or other electrically insulating material may be used.

In one aspect, support members 44, 45 are configured and arranged to support tubular electrodes and provide slidable support for individual or unison movement of electrodes, e.g., by a feed mechanism (not shown). Support member 44 may serve as electrical feedthrough introduced through the lid. In one aspect, support member 44 is configured to be flexible to allow vertical and/or horizontal motion of the associated electrode. An electrode feed mechanism (not shown) may comprise a tubular lead screw whose upper end may be rotated by ballscrew rotated by a gear or step motor or other linear actuator. The feed mechanism can be configured and arranged through the housing and/or lid. In one aspect, the feed mechanism can feed the electrode at a rate of about 5 centimeter (cm)/hour (hr), 10 cm/hr, 15 cm/hr, 20 cm/hr, 25 cm/hr, 30 cm/hr, 35 cm/hr, 40 cm/hr, 45 cm/hr, 50 cm/hr, 55 cm/hr, 60 cm/hr, 65 cm/hr, 70 cm/hr, 75 cm/hr, it being understood that slower or faster rates can be used. These rates are generally applicable for two electrodes operated at a current density of about 2 to about 7 amps/mm$^2$, 3 to about 6 amps/mm$^2$, or 4 to about 5 amps/mm$^2$, with other current densities being applicable. With an electrode feed rate of about 60 cm/hr, with a current density of about 4.5 amps/mm$^2$, for example, the presently described apparatus can produce about 2 kg of multi-metal particles per hour.

In one aspect, the step motors of electrode feed mechanism assembly 26 are controlled by output signals from the controller 20. In addition, as discussed above, controller 20 can independently or concurrently provide control signals to variable frequency high-voltage voltage generator 24 which is electrically connected to the electrodes 50 and 60 so that a selected variable DC potential can be maintained between the opposing ends of the electrodes defining the plasma cloud zone 90.

Controller 20 can receive input signals from one or more sensors, e.g. as exemplified in FIG. 2, such as an optical sensor 28 that can measure the temperature of the electrodes and/or other sensors can determine the gap spacing of the electrodes associated with the plasma cloud zone 90 between the opposing electrode ends. In addition, the controller 20 can also receive feedback signals from current sensor 22 which enable the controller to maintain a substantially constant current to the electrodes.

In one embodiment, a current sensing device is provided, the electrode adjustment means and current sensing device being operably connected such that in use, the electrode adjustment means is automatically adjusted according to the output of the current sensing device. Additional sensors can include a voltmeter for monitoring the voltage across the anode and cathode. Alternatively, additional sensors may comprise temperature sensors to monitor the temperature of the arc and/or electrodes. Preferably, insulating material can be used to electrically isolate the feed mechanism 36 from the electrode 34 and/or other components of the system or apparatus.

A fluid controller, for establishing fluid communication between the axial interior in electrodes or about their exterior can be employed. In one aspect, the fluid controller provides fluid through a tubular elongated electrode directly into the plasma cloud zone 90, the liquid thereafter contained within the housing. In an alternate embodiment, the electrode is a tube with a split line along its longitudinal axis, the split tubing coupled to a fluid coupler (e.g., a Y-joint), the fluid coupler fluidically coupled to the flow controller (not shown) for providing a stream of fluid through the tubular electrode. The controller can be configured and arranged to provide control signals to the fluid controller and/or its associated valves e.g., for controlling the rate and duration of fluid delivery during operation of the apparatus.

Housing 100 as shown in FIG. 4 comprises inlet and/or outlet 40 for manipulating the fluid delivered through electrodes 60 and into the plasma cloud zone 90. Inlet and outlet 40 can be a valve or other device for manual or automated control of fluid flow. In a preferred arrangement, a fluid return circuit is provided between the outlet and the inlet 40, in which case the apparatus preferably also comprises a multi-metal particle recovery device external to or integrated with housing 100. For example, housing 100 can be provided with a multi-metal particle recovery section, e.g., a collector plate located at the base of the housing.

In one aspect, variable frequency high voltage generator 24 is capable of providing 40 KHz-80 KHz range with a 10-90% duty cycle providing about 10-20 KV output can be employed. Other voltages and voltage generators may be used. An Astable multivibrator (555 timer) with adjustable frequency and duty cycle, typically providing 40 khz can be used, by way of example. Power MOSFET (IRF510) drivers (1 per electrode pair) electrically coupled to a flyback transformer (10:20 kv) (1 per electrode pair) can be employed.

Multiplexing and polarity control, including transistor pairs, 1 per electrode, can be used in an H-bridge arrangement (e.g., 200 amp, 600 Volt H-Bridge configuration) or other configuration. A variable current DC supply (128 amps DC), with a Chicago Electric Welding Systems 240 volt inverter welder, nanoparticle control console output current adjustment interface, which supplies 4.5 amps/square mm when using 9 mm electrodes, for example, can be used. Current sensing by a DC current transducer (split core, 0-200 amps DC) can be employed. Multiplexing and polarity control can be accomplished with both mechanical means and solid state electronics. The conventional mechanical contactor approach can provide approximately one polarity reversal per second whereas solid state devices provide for greater than one polarity reversal per second, greater than 10 polarity reversal per second, for example switching rates of about 1 kHz, 10 kHz, 100 kHz. Switching rates of 1 kHz or greater may influence the plasma physics and the particle formation for providing a desired particle size and desired particle shape. For example, the depreciation of the plasma cloud energy from one electrode to another and/or electrical potential effects and their influences on the process as the polarity is switched from one electrode to another are thresholds for the extent of the switching rate and are readily determined with routine experimentation. In one example, multiplexer 25 comprises power transistors used to turn the current on and off to the various electrodes in a programmed sequence and duration. Current (and/or voltage) sensing can be used to detect arc presence and intensity, and control the same to set points in the user setup for optimum generation of desired particle sizes.

In addition, high voltage isolation, via a high voltage choke (150 amp, RF blocking choke), 1 per electrode can be used. For manipulating the electrode positioning during operation, in one aspect a linear servo amplifier with ballscrew actuator driver (12VDC, H-bridge), or PI-LINE OEM board motion controller can be used. Alternatively, a ballscrew or piezoelectric linear motor, with ballscrew actuators, e.g., 150 mm stroke, 110 N (25 lb) force, IP65 (liquid tight) with position feedback, or a ceramic linear drive (PI-LINE piezomotor) can be employed.

In certain aspects, temperature control is desired for the plasma cloud and/or the electrodes. Thus, an OPSENS fiber-optic temperature measurement device, e.g., multi-channel fiber optic temperature measurement module (1 channel per electrode) can be used.

Any type of flow controller 30 can be used to transport liquid to the electrodes, or manipulate liquid contained in housing 100. Flow controllers include pinch valves, syringe pumps, etc., and can be configured for liquid or gas injection (e.g., through or around electrodes) optionally, capable of manipulating slurries, suspensions, or dispersions of particle laden fluids, as well as quench fluid reservoir control, and particle removal and filtration can be used. A proportional-integral-derivative controller (PID loop) in the programmable logic controller (PLC) can provide steady, intermittent, or combination flow rates or a pulsing of the flow into the plasma cloud and/or proximal to the electrode gap. The flow pulse can also be correlated/synchronized with the current flow pulses. Lab View or similar program language can be used to graphically display these relationships and afford integrated adjustment, control, user input, and termination.

This apparatus and method provides a broad range of process combinations of voltage/polarity switching, etc. with discrete adjustments and repeatability. The apparatus can be entirely solid state electronics, or a combination of analog/solid state electronics.

Electrodes

Suitable electrode materials include, independently, non-noble metals, such as one or more of the alkali metals, alkali earth metals, transition metals, noble metals, lanthanides, actinides, post-transition metals, and combinations (alloys) thereof. Exemplary metals include, copper, gold, silver, iron, tungsten, aluminum, titanium, platinum, palladium, vanadium, and nickel), metal alloys of iron (for example, low carbon steels, cast iron), alloys of titanium, alloys of copper/tin.

The electrodes can be configured as bilayer or multilayer electrodes. For example, bilayer electrodes can be made up of an outer layer of gold and an inner core of copper (or visa-versa) for the production of nanosized particles comprising a gold and copper, for example, as a heterogeneous distribution, and/or having a substantially outer layer of a first metal and partially surrounded, yet partially exposed sections of another metal for the production of nanosized particles comprising an alloy-like composition that may include regions of alloyed metals and/or regions of essentially two or more pure metals fused together. In another aspect the multi-layer electrodes can be made up of alternative layers or longitudinally arranged sections of two or more metals suitable for preparing multi-metal compositions.

The one or more anode/cathodes may have the same or different chemical compositions. Exemplary anode/cathode combinations for the production of multi-metal nanoparticles and/or multi-metal coatings include, for example: gold-copper, copper-silver; zinc-copper-silver; zinc-copper; zinc-silver; gold-silver; copper-gold-silver; and copper-gold-silver-zinc. Other combinations of metals and/or alloys can be used.

In addition, the anode or cathode may each comprise more than one material, such that, in use, the plasma cloud causes the materials to react (solid, molten or vapor phase) before forming the multi-metal particle and/or coating particulate matter. Alternatively, the anode and/or cathode electrode material may comprise bi-layer or multilayer structures of two or more metals, such that the layer structures are maintained in the multi-metal particles formed in the process herein disclosed.

In one aspect, one or more of the electrodes can be disk-shaped or of a cylinder shape having a face at one end presenting to the gap a disk-shaped surface, where the disk-shaped electrode or surface comprises two or more metals geometrically arranged such that rotation of the disk and/or cylinder electrodes (e.g., "rotating disc target") provides alternating presentation of the two or more metals to the plasma zone 90. Thus, using such an electrode, relative rotation of such electrode may be induced (e.g., by rotating) to promote separation of the individual materials from the electrode. The speed and duration of the rotation can be controlled as desired to adjust the final composition of the multi-metal particle. In one aspect, a rotating electrode is used to prevent or eliminate the electrodes from sticking to each other and/or facilitate uniform electrode wear. Rotary electrode magazines for long duration batch processes can also be employed.

In other aspects, one or more of the electrodes may contain one or more trace elements which are not available and/or stable and/or provided as an electrode or electrode material. In this aspect inclusion of said trace element can be provided to the resultant multi-metal particle. In one embodiment, the trace element can be a radionuclide, such as an actinide element.

In other aspects, a high melt temperature metal or alloy, e.g. tungsten, can be used for the anode electrode, so that the material of the anode does not degrade/participate, or if so, degrades or participates substantially less than the one or more cathode metal electrodes during particle creation or coating. Thus, in one aspect a high melt temperature metal or alloy can be used as the one or more anodes, and one or more cathodes of a lower melt temperature than that of the anode(s) is used. For example, tungsten anode(s) and cathode(s) of one or more of gold, silver, copper, or zinc.

Methods

Concurrent, real time voltage and current sensing and manipulation (polarity, pulse duration, pulse wave form and amplitude, fiber optic heat sensing at the electrode tips, magnetic manipulation of plasma cloud) with a computer controlled algorithm which integrates the discrete control of single pairs or multiple electrode arrays (multi-positive or multi-negative) in a process methodology combining the real time process sensing, current, voltage and plasma cloud manipulation is provided to control particle size, particle shape and resultant chemistry. Using such control and/or control schemes provides for resulting particles that do not require seed particles to initiate particle creation, may advantageously use lower power e.g., lower voltage and/or current, and provide unique morphologies for the resultant multi-metal particles.

With reference to FIG. 2, during the operation of the apparatus, instructions are provided to controller 20, e.g., via its keyboard or touch screen, causing controller 20 to actuate variable current DC supply 21 and variable frequency high-voltage generator 24 to initiate the plasma cloud in plasma cloud zone 90. Once the arc is initiated by the high voltage discharge, variable DC current power supply unit 21 takes over, producing and/or sustaining the plasma between the electrodes. Once the arc is established the high voltage is turned off. After the plasma cloud is initiated between electrode ends, controller 20 controls step motor etc. of electrode feed mechanism assembly 26 in response to signals from current sensor 22 and controls the current flowing through electrodes 50, 60 so as to maintain appropriate plasma cloud between their respective electrode ends and to maintain a substantially constant energy flow between the electrodes so that the electrode material impinging the plasma cloud vaporizes at a controlled rate, which may be steady state or pulsed. In other words, controller 20 advances at least one of the electrodes 50, 60 toward each other as the material of at least one of the electrode ends is consumed by the vaporization process with continuous using feedback characteristic of the current applied to the electrodes.

Thus, in one aspect, this is achieved by moving, continuously or intermittently, one or more of the electrodes relative to each other or a stationary electrode as material is melted/evaporated. In one aspect, one or more of the electrodes may be a substantially non-consuming electrode, such as tungsten, to maintain or sustain a stable plasma cloud while two or more electrodes comprising the materials to be evaporated and condensed into multi-metal particles can be configured and arranged to define the plasma cloud zone 90 and continuously provide source material into the plasma cloud by electrode feed mechanism assembly 26.

As the vaporization process proceeds, the system and apparatus is configured and arranged such that this gap increase is detected by current sensor 22 which provides a signal to controller 20 causing the controller to actuate step motors of electrode feed mechanism assembly 26 to advance the electrodes to maintain the gap defining the plasma cloud zone 90. Controller 20 receives the electrode current-indicating feedback signal from current sensor 22 and develops a control signal for the multiplexing and polarity control 25 and/or high-voltage generator 24 and/or variable current DC supply 21 so as to maintain substantially constant current to the electrodes and provide a stable multi-metal particle formation process. The number and size of the multi-metal particles produced by the process can optionally be monitored by an optical density sensor (not shown) that provides a signal to the controller 20 so that the controller can control the gap distance, electrode current, pulse duration and waveform to optimize the plasma cloud and thus production of particles with the desired size distribution, chemical composition, and morphology.

As the vaporization process proceeds and the electrodes 50 and 60 become excessively short, fresh electrode surface can be introduced to the plasma cloud zone 90 by the controller signaling electrode feed mechanism assembly 26 (e.g., ballscrew or piezoelectric linear motor). Thus, electrodes can be fed into the apparatus continuously to resupply the plasma cloud while maintaining an optimal gap between the electrodes defining the plasma cloud zone 90.

In one embodiment, one or more first set of electrodes, (e.g., serving as the cathode) is continuously moved relative to a second set of electrodes, (e.g., serving as the anode) whereby the "first set" and the "second set" includes one or individual electrodes, which can be the same or different metals or combinations of metals. Alternatively, in one aspect, one or more "anode" electrodes is held stationary and is surrounded by one or more "cathode" electrodes at a given spacing defining the plasma cloud zone 90. Likewise, in another aspect, one or more "cathode" electrodes is held stationary and is surrounded by one or more "anode" electrodes at a given spacing defining the plasma cloud zone 90. In one aspect, any pair of the one or more electrodes can be spaced apart about 0.05 millimeters (mm) to up to about 3 mm, in certain aspects, between about 0.1 mm to about 1.5 mm, or about 0.2 to about to about 1 mm.

To help maintain a steady state energy flow, at least one of the electrodes can be rotated to prevent localized excess heating and melt "splatter" within the plasma cloud and/or to manipulate the resultant chemical composition of the multi-metal particle. In one aspect, the electrodes are automatically rotated as they are advanced toward one another by the step motors of electrode feed mechanism assembly 26.

Figure 5:
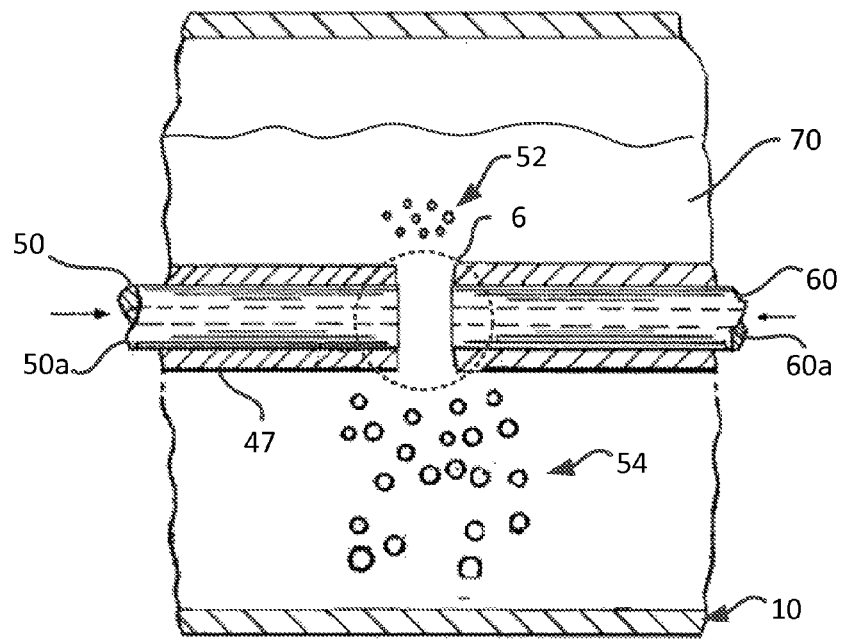
FIG. 5 depicts a partial section view of an apparatus embodiment of the present disclosure.

As shown in FIG. 5, once electrode material is vaporized, within and around immediate vicinity of the plasma cloud, the atomic and/or molecular vapor particles can cluster together and/or collide and or react with other particle clusters to form multi-metal particles 52, 54, that may coalesce and grow in size to bring about larger multi-metal particles that ultimately exit the plasma cloud into the surrounding fluid media of housing 100. Smaller particles 52 that may tend to rise in the liquid media can be separated by filtering or sieving methods to control the multi-metal particle size distribution obtained. Larger particles 54 that may tend to settle can be collected with and/or separated from the fluid medium.

Another embodiment to the particle size separation capabilities of the apparatus is the presence of the flowing liquid delivered to the plasma cloud zone 90 through the passage 40 and/or channel 42 as shown in electrode 60. This fluid, e.g., water, in the illustrated example, propels the nascent multi-metal particles and/or their precursors produced in the plasma cloud essentially omnidirectionally toward an opposing electrode surface 50b and 60b, as indicated by arrows 80 of FIG. 6. While not being held to any particular theory it is believed that the size of the particles in the plasma cloud zone 90 would be represented with the smaller particles being located within the plasma cloud and/or plasma cloud zone 90 and the larger particles distributed radially outward from the plasma cloud zone 90 within the housing. Depending upon the pulse frequency waveform, collisions frequencies, and the rate of cooling before the vaporized electrode material coalesces, reacts, solidifies, or coats, the multi-metal average particle size can be controlled.

Figure 6:
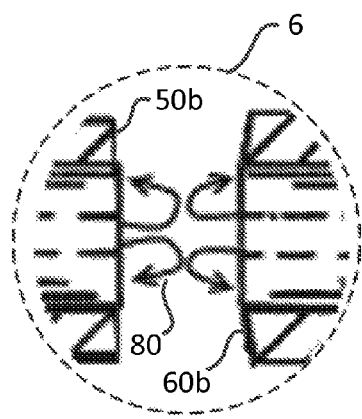
FIG. 6 depicts an exploded view of a section of FIG. 5.

As shown in exploded view FIG. 6, as illustrated by the curved arrows, the smaller nanoparticles trajectories become extended during the milli/microsecond time frame available for coalescence, reaction, and/or solidification. Thus, the flow of fluid through the electrode, or immediately around the electrode(s) within the confines of the gap is believed to provide a "push-back" force to the generated/produced particles, possibly involving them in subsequent plasma cloud events that may increase their size and/or alter their chemical composition "in-situ." Consequently, the apparatus produces a narrower distribution of particle sizes and achieves temperature control within narrow, adjustable tolerances over a controllable thermal profile. This may be especially significant with electrode combinations involving electrodes that electrochemically erode (or are consumed) at different rates, and provide for the creation of multi-metal particles having one metal predominantly with small or trace amounts of another metal, e.g., isolated islands or small areas of the trace amounts of the another metal on or protruding from the surface of the predominant metal, such multi-metal particles being otherwise difficult to create. For example, if metal A erodes more easily than metal B, and metal C, (erosion A greater than B greater than C), the system can be configured for creating equal erosion (consumption) of each metal electrode and therefore provide particles having an equal ratio of each element. Alternatively, unequal erosion can be provided to electrodes where metal A erodes more easily than metal B, and metal C, so as to produce particles having an unequal ratio of each element. In one aspect, the metal electrode having the slowest erosion rate of the electrodes used, at the given current applied, can be maintained at a positive potential whereas the remaining electrodes (having greater erosion rates) can be maintained at a negative potential and/or continuously switched from positive to negative potential. Thus for example, two electrodes may be negatively charged with only one electrode positively charged. Alternatively, two positively charged electrodes with a single negatively charged electrode can be used. The surface area of the corresponding electrodes that define the plasma cloud zone 90 can be adjusted to maximize stability of the plasma cloud. The liquid may facilitate control over the temperature of the electrodes within relatively narrow, yet adjustable tolerances, which can contribute to a steady energy transfer within the plasma cloud.

Figure 7:
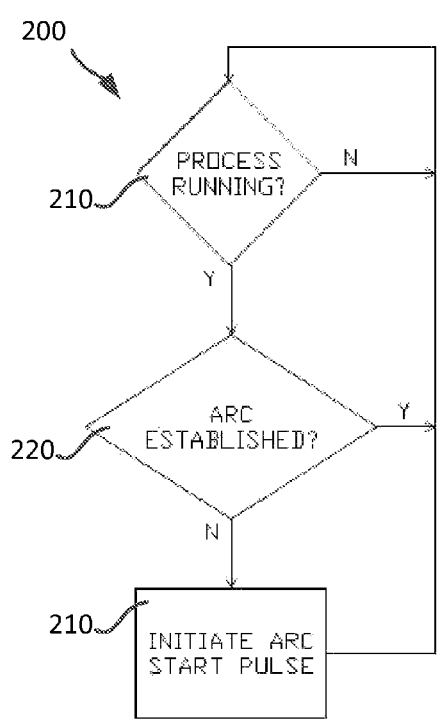
FIG. 7 depicts as an exemplary embodiment, a process flow diagram for operation of the apparatus of the present disclosure.
Figure 8:
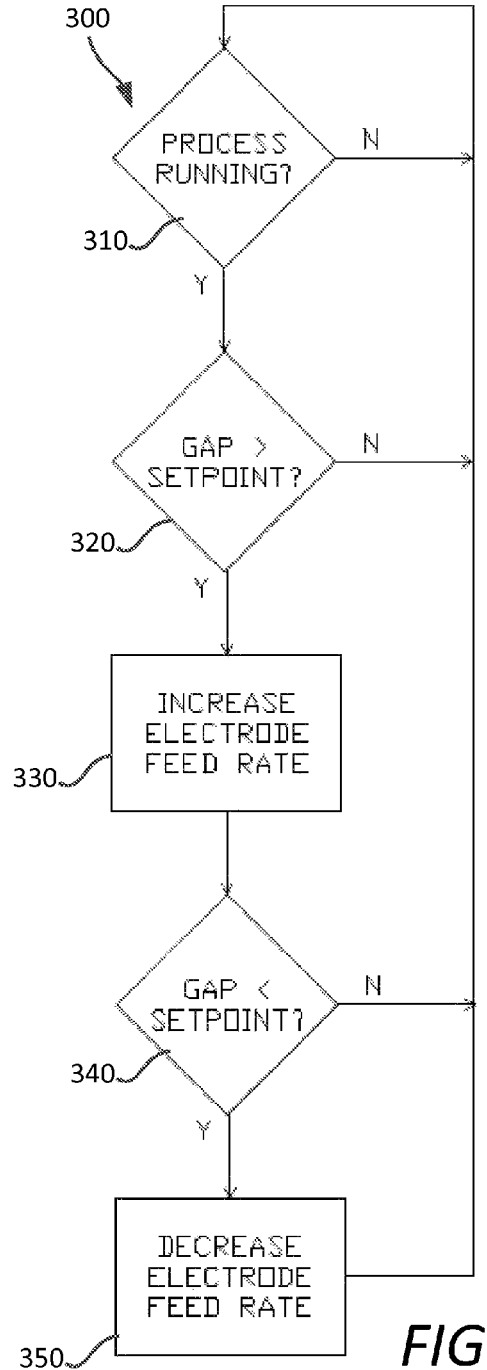
FIG. 8 depicts as an exemplary embodiment, a parallel process flow diagram of in combination with the process flow diagram of FIG. 7.

Referring now to FIG. 7 and FIG. 8, flow charts 200 and 300, respectively, are shown. Process 200 comprises process step 210 initiating arc via start pulse. Process 220 determines if arc is established and if not, the process is routed back to step 210. Once the arc is established, step 230 maintains apparatus operation until the next pulse sequence or other event, otherwise the process flow is sent back to arc initiation step 210. FIG. 8 provides parallel process 300 with process 200, where step 310 determines whether the process is currently running and if so, step 320 determines whether the present electrode gap defining plasma cloud zone 90 is greater than a setpoint. If the gap is greater than setpoint of step 320, step 330 provides for electrode feed increase. Step 330 is bounded by step 340 as to a gap less than the setpoint the step 350 provides for a decrease in electrode feed rate. Thus, the combination of steps 320, 330, 340, and 350 maintains proper electrode gap. Setpoints can be predetermined or can be calculated by the PLC unit during operation, or can be user-entered before or during operation.

Each process step of processes 200 and 300 can include user setpoints and current sensing (possible additional arc voltage sensing), fluid flow (steady state/pulsed) into (plasma cloud) electrode gap; chamber fill/evacuation/separation of micro and/or nano-sized multi-metal particles; chamber presets for degassing/debubble etc. with optional vacuum source control. In addition, manual and/or sensor inputs can be provided to the programmable logic controller and/or outputs provided to one or more linear actuators for control of electrode gaps and/or electrode feed rate; high voltage arc-start module and high current supply (for control of arc current), as well as flow control devices (fluid and/or gas and/or organo-metallics or precursors) and pumps etc. Digital and/or analog cards coupled to a computer or processor capable of providing real-time control can be used. For example, a process control system with digital and analog inputs and outputs utilizing a Programmable Logic Controller (PLC) with a graphical user interface (color touch screen) and a PC for information input and program storage can be integral or independently coupled to the apparatus. Ladder Logic in the PLC is used for electrode gap control and arc commanded arc current via a PID loop, based on measurements from the current sensor (actual arc current) and electrode gap voltage. Sensing electrode gap voltage can also be employed (not shown). In addition to voltage, current, pulse duration, pulse waveform and amplitude, heat sensing and/or magnetic manipulation of the plasma cloud additional process parameter control features and/or controls may be employed. For example, pH maintenance to a set point to limit particle corrosion, including sensing and automatic adjustment of the liquid and/or liquid bath containing the multi-metal particles. Also, fluid reactor volume pressure balancing and scrubbing with inert gases can be employed, which encompasses automatic de-oxygenation and spent gas elimination of gaseous contaminates from the cooling fluid or reactor fluid volume.

In one aspect, fluid is moved either through the electrodes or immediately around the electrodes with a force of about 5 psi, for example. In other aspects, the fluid is moved either through the electrodes or immediately around the electrodes with a force of less than 5 psi or greater than 5 psi up to about 25 psi. In one aspect the fluid is water that may be essentially pure or may contain dispersion aids or other additives to assist in maintaining the multi-metal particles suspension and/or removal and/or isolation. Other fluid media may be used and/or combined such as ionic fluids, poly ionic fluids, mixtures of inorganic/organic liquids, mixtures of water with organic liquids or solids. In one aspect the system is run using a fluid maintained at or near room temperature, and/or the temperature of the fluid can be controlled using heating and/or cooling means. In one aspect cryogenic fluids are excluded. In addition to fluids, gasses may be introduced through or around one or more of the electrodes such that the gases are introduced into the plasma zone 90. Such gases may include the nonreactive noble gases (e.g. helium, argon, neon, krypton, etc.) and/or reactive gases such as carbon dioxide, oxygen, ozone, hydrogen, sulfur dioxide, nitric oxide, ammonia, chlorine, fluorine, bromine, and iodine, and mixtures thereof.

Multi-Metal Particle Preparation

It will be understood that where the anode and cathode have different compositions, the multi-metal particle formed will have the composition of at least part of the anode, the cathode, or a mixed composition or composite, or multi-layer composition, or will be the reaction product between the two electrode materials. The exact composition and structure of the resultant multi-metal particle depends, inter alia, on the electrode materials, the current density (and hence temperature) of the plasma cloud and the melting points or evaporation temperatures or electrical conductivity of the electrodes and the species present in the plasma cloud. Another aspect of the present method and apparatus comprises introducing other elements, metals or non-metals into the plasma cloud. Such other materials may include precursor compounds to form compounds that are not available, unstable, and/or hazardous. For example, if even available in the form of a solid electrode. In one aspect, such materials or precursor materials would be introduced via the fluid channel 42. In other aspect, the material or precursor would be present in the fluid or comprise the fluid, e.g., liquid ammonia. A non-limiting example of such materials and precursors include semi-metals which are liquids at room temperature and/or otherwise hazardous in solid form, such as gallium and indium, as well as other elements and substances. Either or both of these elemental forms can be presented to particles for reaction with or coating onto the surface thereof by introducing a compound having the element. For example, trimethyl gallium can be introduced to the plasma cloud to provide a source of gallium, and/or trimethyl indium, can be introduced to provide a source of indium to the particulate material or provide particles of the respective elements. In another embodiment, the resultant multi-metal particles can be prepared from electrodes containing radionuclide or by introduction of a radionuclide precursor to the plasma cloud zone, and the radionuclide-multi-metal particle used for tracing, medical imaging, or medical diagnostics. In one aspect, a method of medical imaging and/or medical diagnostics is provided by preparing the multi-metal particle comprising at least one radionuclide, presenting the multi-metal particle comprising at least one radionuclide to a subject in need thereof (of imaging and/or diagnostics) for detection using an auxiliary device capable of detecting the multi-metal particle comprising at least one radionuclide. Such multi-metal particle comprising at least one radionuclide include particles with 0.01% to 10% $^{99m}$Tc, $^{111}$In, and/or $^{67}$Ga, Such auxiliary devices include Magnetic Resonance Imaging (MRI), Positron Emission Tomography (PET/CT), and Nuclear Magnetic Resonance (NMR), and other devices or equipment configured to detect radionuclides. Such radionuclide particles can be administered to mammalian subjects for diagnostics and/or treatment of a medical condition or disease.

In another aspect, material or precursor materials of target element(s) can be introduced to the plasma cloud via the fluid channel 42 to control the amount of target element(s) so as to provide very low concentrations of the target element, either as a coating component or as part of a multi-metal particle. Such low concentration-target element particle and coating construction using electrodes of the target element would not be controllable. For example, inclusion of titanium at parts per million concentrations in a coating or as a component of a multi-metal particle can be employed, by introduction of titanium isopropoxide or other liquid organometallic compounds of titanium. Other metals and organometallic precursor compounds can be used, for example, oxo, dioxo or nitrido forms of radionuclides, for example pertechnetate ($^{99m}$TcO$^{4-}$) or its perrhenate.

In other embodiment, the method and apparatus herein disclosed provides for the formation of materials, e.g., multimetal particles and/or carbides and/or nitrides of a metal or non-metal. Thus, for example, using the fluid channel 42, one or more metal/non-metal precursor compounds can be introduced to the plasma cloud using a second reactive species, e.g., ammonia, methane, silane, azide to facilitate the creation of metal/non-metal nitride and/or carbides species, etc.

In certain aspects, the metal alloy particles can provide a content of a first metal as the first metal species in some or all of multi-metal particle in the range of from 99 to 0.1 percent by weight, and the content of a second metal species in some or all of the multi-metal particle in the range of from 0.1 to 99 by weight. In one aspect, some or all of the multi-metal particles comprise silver and copper. In another aspect, some or all of the multi-metal particles comprise copper, zinc, or silver. In another aspect, some or all of the multi-metal particles comprise zinc, copper, silver, and another metal.

In certain embodiments, the average particle size distribution of the multi-metal particles is Gaussian or bimodal or combination of Gaussian and bimodal. In one aspect, the average particle size distribution of the multi-metal particles is between about 0.1 nm and about 1000 nm, about 1 nm and about 500 nm, about 10 nm and about 250 nm, or about 50 nm and about 150 nm. In one aspect, the average particle size distribution of the multi-metal particles are about 100 nm.

Coating Particulate Matter

In another embodiment of the present disclosure the present apparatus provides for methods of coating particulate matter with multi-metal compositions formed in the plasma cloud using the apparatus and methods herein disclosed.

Thus, in one aspect, the present method comprises the direct or indirect introduction of particulate matter into the continuum of the plasma cloud for coating of the particulate matter. In one aspect, the particulate matter is ceramic or metal oxide particles. To avoid electrical influence on particles to be coated, those particles are introduced via electrically insulating tube(s), e.g. fused silica, within a non-degrading electrode into the plasma cloud. The particulate matter can be introduced continuously, semi-continuously, e.g., pulsed, during operation of the apparatus. In one aspect the particulate matter is pulsed in sequence with a pulsed plasma operation of the apparatus.

In one aspect, particulate matter is introduced to the plasma cloud to interact with the metal particles produced by the apparatus and method disclosed herein. This may be done by introducing a stream of fluid containing the particulate matter into the plasma cloud. One or more of the components of the multi-metal particle precursor materials can interact with the particulate matter forming a coating thereon or a reaction product thereof.

The particulate matter can include one or more of inorganic oxide, inorganic carbide, or inorganic nitrides, for example, oxides/nitrides/carbides of boron, titanium, zinc, iron, tungsten, vanadium, aluminum, oxides of silver, oxides of copper, oxides of tin, strontium, and mixtures thereof. The oxides in the adjustable materials or coatings can include sub-oxides, stoichiometric oxides, and super-oxides, and includes, without limitation, one or more of $TiO_2$, $ZnO$, $Fe_2O_3$, $WO_3$, $SnO_2$, $Al_2O_3$, TiN, SiC, AlN and BN. The one or more of inorganic oxide, inorganic carbide, or inorganic nitrides can be used in a form that is suitable for incorporation into the fluid controller of the apparatus. The one or more of inorganic oxide, inorganic carbide, or inorganic nitrides can be of a size suitable for such applications, including micron particles, submicron particles, nanoparticles, and physical mixtures and/or distributions thereof. The morphology of the multi-metal coating on the particulate matter can be controlled as described above, either by selection of the electrode material, voltage, current, or frequency waveform duration, etc.

The presently disclosed multi-metal particles can be added to materials normally used in the fabrication or construction of interior/exterior vehicle components, lawn/garden equipment, building/construction materials, medical devices and/or equipment. The presently disclosed method provides for coating and/or reacting and/or concentrating at the surface of the particulate matter the instant multi-metal compositions described above.

Batch/Semi-Batch/Continuous Processing

The instantly described apparatus and/or process may be configured and design to operate as a batch process, the particles being recovered after discontinuation of the electrical charge and removal of the fluid and/or filtration. In other aspects, the multi-metal particles can remain in the presence of the fluid protected from contact by air and further manipulated or used as a suspension, slurry, or dispersion.

Alternatively, the instantly described apparatus and/or process may be continuous, the method including a step of continuously filtering the fluid and isolating the multi-metal particles, which can be further sieved or separated based on particle size distribution. In one aspect, the multi-metal particles are separated from the fluid and then the fluid is recycled back over the electrodes in a continuous manner using the flow control system.

From the foregoing description, various modifications and changes in the compositions and method will occur to those skilled in the art without varying from the scope of the invention as defined in the following claims.

What is claimed:

1. An apparatus comprising:
   a controller;
   a first electrode;
   a second electrode, the second electrode arranged spaced apart from said first electrode defining between the first electrode and the second electrode a plasma cloud zone sized to generate a plasma cloud;
   an electrical power supply coupled to the controller and arranged for applying one or more high voltage pulses to the first and second electrodes;
   a current detector coupled to the controller and at least one of the first or the second electrodes, the current detector configured and arranged to provide a first signal corresponding to the plasma cloud zone; and
   a linear actuator coupled to controller and at least one of the first and the second electrodes, the linear actuator configured and arranged to advance one or more of the first or second electrode corresponding to the first signal; and
   a fluid controller configured and arranged for introducing a fluid into the plasma cloud zone via a conduit fluidically coupled to a channel surrounding the first electrode or the second electrode.

2. An apparatus of claim 1, wherein the fluid controller is configured to present particulate matter together with the fluid to the plasma cloud zone.

3. An apparatus of claim 1, wherein the second electrode is of a different elemental composition than the first electrode.

4. An apparatus of claim 1, wherein the second electrode is of a different corrosion rate at a given applied current than the first electrode.

5. An apparatus of claim 1, wherein first electrode is of a higher melt temperature than that of the second electrode at a given applied current capable of melting and vaporizing the second electrode.

6. An apparatus of claim 1, wherein at least one of said first and second electrodes are rotatable.

7. An apparatus of claim 1, wherein the first and the second electrodes are elongated tube or wire, the apparatus further comprising additional elongated electrodes arranged spaced apart from the first electrode and the second electrode, the additional elongated electrodes further defining the plasma cloud zone, one or more of the additional elongated electrodes being of the same or different elemental composition as the first electrode or the second electrode, the longitudinal axis of both the first and second electrodes and the longitudinal axes of each of the additional elongated electrodes intersecting within the plasma cloud zone defined thereby.

8. An apparatus of claim 7, wherein at least one of the one or more of the additional electrodes is of a higher melt temperature at an applied current capable of melting or vaporizing at least one other additional electrodes or one of the first or the second electrodes.

9. An apparatus of claim 1, further comprising one or more sensors, the one or more sensors operably connected to the controller such that in use, the distance between the first electrode and the second electrode or the plasma cloud is automatically adjusted according to the output of the one or more sensors.

10. A method of producing multi-metal particles, the method comprising in an apparatus as defined in claim 1, supporting at least the first electrode and the second electrode as a first pair of elongated electrodes coaxially arranged with corresponding ends thereof spaced apart, the pair of elongated electrodes defining the plasma cloud zone, wherein the combination of the first pair of elongated electrodes comprise at least two metals;

applying a potential difference to the first electrode pair so that a plasma cloud is formed and at least substantially maintained in the plasma cloud zone between the first pair of elongated electrode ends; and consuming at least a portion of one or more of the at least one pair of electrodes;

directing a fluid stream around at least one of the electrodes of the first pair of elongated electrodes and towards the plasma cloud zone.

11. A method of claim 10, wherein one of the pair of elongated electrodes is of a higher melt temperature at an applied current capable of melting or vaporizing the corresponding other elongated electrode.

12. A method of claim 10, wherein the first pair of elongated electrodes comprise a transition metal anode or a noble metal anode, and a transition metal cathode or a noble metal cathode.

13. A method of claim 12, wherein the anode and cathode is comprised of a metal selected from the group consisting of platinum, palladium, silver, zinc, copper, nickel, gold, and alloys thereof.

14. A method of claim 10, wherein the first pair of elongated electrodes comprise a transition metal anode, and a noble metal cathode or wherein the first pair of elongated electrodes comprise a transition metal cathode, and a noble metal anode.

15. A method of claim 10, further comprising additional elongated electrodes arranged spaced apart from the first pair of elongated electrodes and the additional elongated electrodes further defining the plasma cloud zone, one or more of the additional elongated electrodes being of the same or different elemental composition as the first electrode or the second electrode, the longitudinal axes of the first pair of elongated electrodes and the longitudinal axes of each of the additional elongated electrodes intersecting within the plasma cloud zone defined thereby.

16. A method of claim 15, wherein at least one of the one or more of the additional electrodes is of a higher melt temperature at an applied current capable of melting or vaporizing at least one other additional electrodes or one of the first pair of elongated electrodes.

17. A method of claim 10, further comprising introducing particulate matter into the plasma cloud.

18. A method of claim 17, wherein the particulate matter is an inorganic oxide, inorganic carbide, inorganic nitride, or mixture thereof.

19. A multi-metal particle formed by the method of claim 10, having an average particle size between 1 and 1000 nanometers.

20. Particulate matter coated or combined with a multi-metal particle formed by the method of claim 17.

21. A method of claim 10, further comprising introducing a metal precursor into the plasma cloud.

22. A method of claim 21, wherein the metal precursor is an organometallic compound, a radionuclide, or an organometallic compound and a radionuclide.

23. Particulate matter coated or combined with a multi-metal particle formed by the method of claim 21.

24. A system for producing multi-metal particles or solutions thereof, the system comprising:

a housing configured to retain a fluid medium;

a power supply source capable of controlling electric current, voltage, or current and voltage;

a metal or metal alloy cathode operably connected to the power supply source;

a metal or metal alloy anode operably connected to the power supply source and spaced apart from the metal or metal alloy cathode such that a plasma cloud zone is defined between the metal or metal alloy anode and metal or metal alloy cathode, wherein at least two metals constitute the combination of cathode and anode;

a control unit arranged and configured for moving at least one of the metal or metal alloy anode or the metal or metal alloy cathode to maintain the plasma cloud zone; and a flow controller configured to deliver a fluid medium via a conduit fluidically coupled to a channel surrounding the housing or the a metal or metal alloy anode into the plasma cloud zone.

25. A system of claim 24, wherein the metal or metal alloy anode is of a higher melt temperature at an applied current capable of melting or vaporizing the metal or metal alloy cathode.

26. A system of claim 24, wherein the metal or metal alloy anode comprises a transition metal, and the metal or metal alloy cathode comprises a noble metal.

27. A system of claim 24, wherein the metal or metal alloy anode and cathode is comprised of a metal selected from the group consisting of tungsten, platinum, palladium, silver, zinc, copper, nickel, gold, and alloys thereof.

28. A system of claim 24, further comprising additional electrodes arranged spaced apart from the metal or metal alloy cathode and the anode electrode, and the additional elongated electrodes further defining the plasma cloud zone, one or more of the additional electrodes being of the same or different elemental composition as the metal or metal alloy cathode and anode.

29. A system of claim 28, wherein the metal or metal alloy anode is of a higher melt temperature at an applied current capable of melting or vaporizing at least one of the additional electrodes.

30. The system of claim 24, wherein the fluid flow controller is configured to introduce fluid with particulate matter and/or organometallics and/or radionuclides into the plasma cloud zone.

31. The system of claim 19, wherein the system further comprises a linear actuator coupled to the metal or metal alloy cathode electrode, wherein the linear actuator is configured to move the metal or metal alloy cathode.

32. The system of claim 31, wherein the metal or metal alloy cathode is rotatable.

33. The system of claim 30, further comprising conduits in fluidic communication between the fluid flow controller, metal or metal alloy anode electrode, and the housing.

* * * * *